United States Patent
Allen et al.

(10) Patent No.: US 9,093,387 B1
(45) Date of Patent: Jul. 28, 2015

(54) METALLIC MASK PATTERNING PROCESS FOR MINIMIZING COLLATERAL ETCH OF AN UNDERLAYER

(71) Applicant: International Business Machines Corporation, Armonk, NY (US)

(72) Inventors: Scott D. Allen, Ledgewood, NJ (US); Kuang-Jung Chen, Poughkeepsie, NY (US); Huihang Dong, Danbury, CT (US); Wai-Kin Li, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 14/149,898

(22) Filed: Jan. 8, 2014

(51) Int. Cl.
*H01L 21/3105* (2006.01)
*H01L 21/311* (2006.01)
*H01L 21/033* (2006.01)
*H01L 21/02* (2006.01)
*H01L 21/027* (2006.01)

(52) U.S. Cl.
CPC ...... *H01L 21/31056* (2013.01); *H01L 21/0214* (2013.01); *H01L 21/0217* (2013.01); *H01L 21/0276* (2013.01); *H01L 21/02164* (2013.01); *H01L 21/02271* (2013.01); *H01L 21/0332* (2013.01); *H01L 21/0337* (2013.01); *H01L 21/31111* (2013.01); *H01L 21/31138* (2013.01); *H01L 21/31144* (2013.01)

(58) Field of Classification Search
CPC ............. H01L 21/76808; H01L 21/76224; H01L 21/76811; H01L 21/76831; H01L 21/31056; H01L 21/31144; H01L 21/0332; H01L 21/31138; H01L 21/31111; H01L 21/0337; H01L 21/02164; H01L 21/0217; H01L 21/0214; H01L 21/02271; H01L 21/0276; H01L 2221/1063; H01L 23/53266; H01L 23/5329; H01L 23/28
See application file for complete search history.

(56) References Cited

U.S. PATENT DOCUMENTS

| | | | |
|---|---|---|---|
| 6,323,121 B1 * | 11/2001 | Liu et al. | 438/633 |
| 6,448,177 B1 * | 9/2002 | Morrow et al. | 438/638 |
| 6,455,411 B1 * | 9/2002 | Jiang et al. | 438/624 |
| 6,514,860 B1 * | 2/2003 | Okada et al. | 438/687 |
| 6,720,256 B1 * | 4/2004 | Wu et al. | 438/638 |
| 6,743,713 B2 | 6/2004 | Mukherjee-Roy et al. | |

(Continued)

FOREIGN PATENT DOCUMENTS

WO    WO0002235    1/2000

*Primary Examiner* — Brett Feeney
*Assistant Examiner* — Sophia Nguyen
(74) *Attorney, Agent, or Firm* — Scully, Scott, Murphy & Presser, P.C.; Yuanmin Cai

(57) ABSTRACT

A stack of a dielectric material layer and a metallic material layer are formed on a substrate. A first organic planarization layer, a non-metallic hard mask layer, and a photoresist layer are sequentially deposited over the metallic material layer. The photoresist layer is lithographically patterned, and the pattern in the photoresist layer is transferred through the non-metallic hard mask layer, the first organic planarization layer, and the metallic material layer to form a cavity. A second organic planarization layer is deposited within the cavity and over remaining portions of the photoresist layer. The second organic planarization layer and the photoresist layer are recessed, and the non-metallic hard mask layer is subsequently removed. Remaining portions of the first and second organic planarization layers are simultaneously removed to provide physically exposed surfaces of the patterned metallic material layer and a top surface of the dielectric material layer.

20 Claims, 4 Drawing Sheets

(56) References Cited

U.S. PATENT DOCUMENTS

| | | | |
|---|---|---|---|
| 6,774,028 B2 * | 8/2004 | Nagahara | 438/624 |
| 6,797,633 B2 * | 9/2004 | Jiang et al. | 438/706 |
| 6,881,678 B2 * | 4/2005 | Lee | 438/740 |
| 7,176,123 B2 * | 2/2007 | Kim et al. | 438/637 |
| 7,214,609 B2 * | 5/2007 | Jiang et al. | 438/637 |
| 7,351,661 B2 | 4/2008 | Heo et al. | |
| 7,435,676 B2 * | 10/2008 | Dalton et al. | 438/636 |
| 7,470,616 B1 * | 12/2008 | Akinmade-Yusuff et al. | 438/637 |
| 7,564,136 B2 * | 7/2009 | Yeh et al. | 257/773 |
| 7,569,486 B2 * | 8/2009 | Choi et al. | 438/702 |
| 7,637,269 B1 * | 12/2009 | Zin et al. | 134/1.2 |
| 7,838,415 B2 * | 11/2010 | Chang et al. | 438/637 |
| 7,910,477 B2 * | 3/2011 | Jacques et al. | 438/636 |
| 8,106,455 B2 * | 1/2012 | Greene et al. | 257/347 |
| 8,129,843 B2 | 3/2012 | Arnold et al. | |
| 8,399,922 B2 | 3/2013 | Chang et al. | |
| 8,415,209 B2 | 4/2013 | Rooyackers et al. | |
| 8,445,382 B2 | 5/2013 | Besling | |
| 8,461,043 B2 | 6/2013 | Rozenblat et al. | |
| 8,906,794 B1 * | 12/2014 | Patzer et al. | 438/586 |
| 2002/0182874 A1 * | 12/2002 | Wang | 438/706 |
| 2004/0043586 A1 * | 3/2004 | Ahmed et al. | 438/514 |
| 2004/0127016 A1 * | 7/2004 | Hoog et al. | 438/637 |
| 2004/0259355 A1 * | 12/2004 | Yin et al. | 438/689 |
| 2005/0014361 A1 * | 1/2005 | Nguyen et al. | 438/623 |
| 2005/0118800 A1 * | 6/2005 | Brakensiek et al. | 438/633 |
| 2005/0233572 A1 * | 10/2005 | Su et al. | 438/618 |
| 2006/0154400 A1 * | 7/2006 | Choi et al. | 438/49 |
| 2007/0218679 A1 * | 9/2007 | Schneider et al. | 438/638 |
| 2008/0014533 A1 * | 1/2008 | Keller et al. | 430/311 |
| 2008/0142988 A1 * | 6/2008 | Hyland et al. | 257/774 |
| 2008/0149992 A1 * | 6/2008 | Gidon | 257/316 |
| 2010/0048011 A1 * | 2/2010 | Yeh et al. | 438/591 |
| 2010/0203709 A1 * | 8/2010 | Czubatyj | 438/478 |
| 2010/0258881 A1 * | 10/2010 | Chudzik et al. | 257/410 |
| 2011/0012226 A1 | 1/2011 | Lee | |
| 2011/0092069 A1 * | 4/2011 | Cheng et al. | 438/672 |
| 2012/0006396 A1 * | 1/2012 | Cotte et al. | 136/256 |
| 2013/0001750 A1 * | 1/2013 | Arnold et al. | 257/618 |
| 2013/0009248 A1 | 1/2013 | Chang et al. | |
| 2013/0099295 A1 * | 4/2013 | Baars et al. | 257/288 |
| 2013/0214391 A1 * | 8/2013 | Choi et al. | 257/622 |
| 2013/0216776 A1 * | 8/2013 | Arnold et al. | 428/141 |
| 2014/0024191 A1 * | 1/2014 | Chen et al. | 438/294 |
| 2014/0256145 A1 * | 9/2014 | Abdallah et al. | 438/703 |
| 2014/0264685 A1 * | 9/2014 | Cheng et al. | 257/432 |
| 2015/0004760 A1 * | 1/2015 | Kim et al. | 438/158 |
| 2015/0076586 A1 * | 3/2015 | Rabkin et al. | 257/324 |

* cited by examiner

METALLIC MASK PATTERNING PROCESS FOR MINIMIZING COLLATERAL ETCH OF AN UNDERLAYER

BACKGROUND

The present disclosure relates to methods of patterning a metallic material layer on a dielectric material layer and structures for effecting the same.

Patterning of a metallic material layer overlying a dielectric layer can result in collateral damages of the underlying dielectric layer. In case the functionality of the dielectric layer is affected by collateral damages as in the case of a gate dielectric layer, minimizing the collateral damages during the processing steps is critical in providing high performance and/or reliability in the device employing the dielectric layer.

For example, a patterning process for a stack of a high dielectric constant (high-k) gate dielectric layer including a dielectric metal oxide and a metallic material layer can employ an etch mask stack including a second metallic material layer in addition to a photoresist layer. While the second metallic material layer can be advantageously employed to generate a high fidelity replica of the pattern in the photoresist layer, removal of the second metallic material layer can result in collateral etch of the high-k gate dielectric layer and metallic contamination in a processing tool. Further, removal of additional materials in the etch mask stack can result in further collateral etching of the metallic material layer. Thus, a method is desired for patterning a metallic material layer while minimizing collateral etches of an underlying dielectric layer and avoiding metallic contamination.

SUMMARY

A stack of a dielectric material layer and a metallic material layer are formed on a substrate. A first organic planarization layer, a non-metallic hard mask layer, and a photoresist layer are sequentially deposited over the metallic material layer. The photoresist layer is lithographically patterned, and the pattern in the photoresist layer is transferred through the non-metallic hard mask layer, the first organic planarization layer, and the metallic material layer to form a cavity. A second organic planarization layer is deposited within the cavity and over remaining portions of the photoresist layer. The second organic planarization layer and the photoresist layer are recessed, and the non-metallic hard mask layer is subsequently removed. Remaining portions of the first and second organic planarization layers are simultaneously removed to provide physically exposed surfaces of the patterned metallic material layer and a top surface of the dielectric material layer.

According to an aspect of the present disclosure, a method of forming a patterned structure is provided. A vertical stack is formed over a dielectric material layer on a substrate. The vertical stack includes, from bottom to top, a metallic material layer, a first organic planarization layer, and a non-metallic hard mask layer. A cavity is formed through the non-metallic hard mask layer, the first organic planarization layer, and the metallic material layer. A top surface of the dielectric material layer is physically exposed underneath the cavity. A second organic planarization layer is applied in the cavity and over the non-metallic hard mask layer. An upper portion of the second organic planarization layer is recessed. The non-metallic hard mask layer is removed. A lower portion of the second organic planarization layer and the first organic planarization layer are removed. The top surface of the dielectric material layer is physically exposed again.

DETAILED DESCRIPTION

Figure 1:
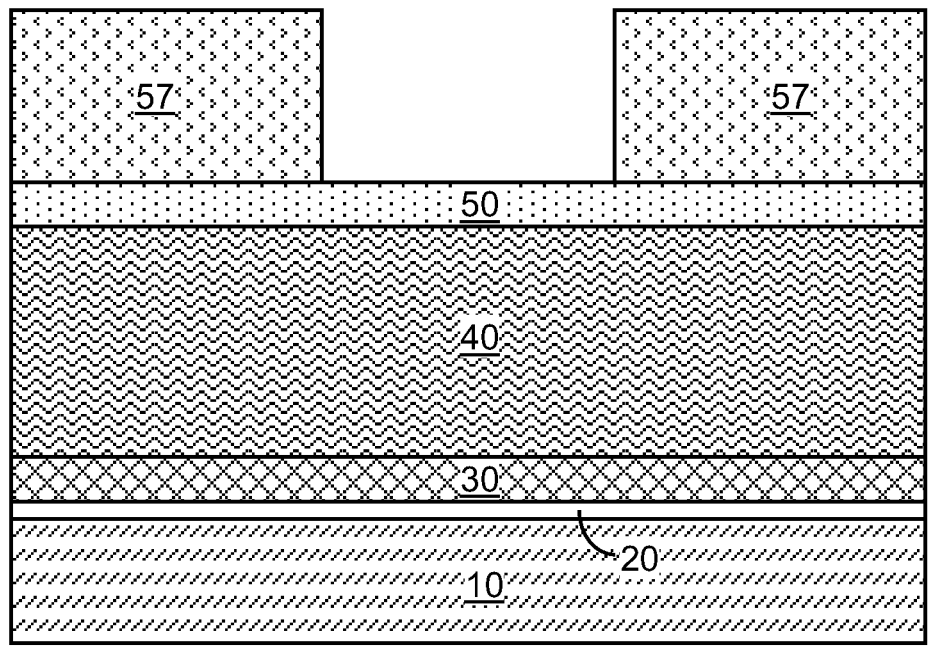
FIG. 1 is a vertical cross-sectional view of an exemplary structure after formation of a stack including a dielectric material layer, a metallic material layer, a first organic planarization layer, a dielectric mask layer, and a patterned photoresist layer on a substrate according to an embodiment of the present disclosure.

As stated above, the present disclosure relates to methods of patterning a metallic material layer on a dielectric material layer and structures for effecting the same, which are now described in detail with accompanying figures. It is noted that like and corresponding elements are referred to by like reference numerals. The drawings are not in scale. As used herein, ordinals such as "first" and "second" are employed merely to distinguish similar elements, and different ordinals may be employed to designate a same element in the specification and/or claims.

Referring to FIG. 1, an exemplary structure according to an embodiment of the present disclosure includes a material stack formed on a substrate 10. The material stack includes, from bottom to top, of a dielectric material layer 20, a metallic material layer 30, a first organic planarization layer 40, a dielectric mask layer 50, and a patterned photoresist layer 57.

The substrate 10 can include any solid material. The substrate 10 can include at least one semiconductor material, at least one conductive material, at least one dielectric material, or a combination or a stack thereof. Semiconductor materials that can be included in the substrate 10 include, but are not limited to, an elemental semiconductor material such as silicon or germanium; an alloy of Group IV elements such as a silicon-germanium alloy, a silicon-carbon alloy, and a silicon-germanium-carbon alloy; a compound semiconductor material; an organic semiconductor material; and combinations thereof. Metallic material that can be included in the substrate 10 include, but are not limited to, an elemental metal, an intermetallic alloy, a conductive metallic nitride, a conductive metallic carbide, and combinations and alloys thereof. Dielectric materials that can be included in the substrate 10 include, but are not limited to, a dielectric oxide of at least one semiconductor element such as silicon oxide, a dielectric nitride of at least one semiconductor element such as silicon nitride, a dielectric metal oxide, a dielectric metal nitride, and combinations and alloys thereof.

In one embodiment, the substrate 10 can be sufficiently thick to provide mechanical support for the material stack thereupon. In one embodiment, the thickness of the substrate 10 can be in a range from 30 microns to 1 mm, although lesser and greater thicknesses can also be employed.

In one embodiment, the topmost portion of the substrate 10 can include a semiconductor layer embedding various doped semiconductor material portions. For example, the substrate 10 can include source and drain regions of field effect transistors that are formed in a semiconductor material portion. The semiconductor material portion can be a planar semiconductor portion laterally surrounded by a shallow trench isolation structure (not shown) and having a top surface that is coplanar with the topmost surface of the substrate 10, or can be a semiconductor fin as known in the art.

In one embodiment, the topmost portion of the substrate 10 can include a metal interconnect structure including at least one interlayer dielectric (ILD) material layer and at least one metal line structure and/or at least one metal via structure as known in the art. In this case, the topmost portions of the substrate can include a dielectric material such as silicon oxide, silicon nitride, porous or non-porous organosilicate glass, or combinations thereof. Further, at least one metal line structure and/or at least one metal via structure, if present, can include a metallic material such as copper, aluminum, tungsten, a metallic nitride, a metallic carbide, or a combination thereof.

The dielectric material layer 20 can include any dielectric material. In one embodiment, the dielectric material layer 20 can include a dielectric material that is known to be suitable for a gate dielectric of a field effect transistor. The thickness of the dielectric material layer 20 can be in a range from 1 nm to 20 nm, although lesser and greater thicknesses can also be employed. In one embodiment, the dielectric material layer 20 can include a dielectric oxide of at least one semiconductor element such as silicon oxide or a silicon-germanium oxide, or a dielectric oxynitride of at least one semiconductor element such as silicon oxynitride or a silicon-germanium oxynitride.

In another embodiment, the dielectric material layer 20 can include a high dielectric constant (high-k) dielectric material. As used herein, a high-k dielectric material refers to a dielectric material having a dielectric constant greater than 7.9. In one embodiment, the high-k dielectric material of the dielectric material layer 20 can include a dielectric metal oxide. Exemplary high-k dielectric materials that can be employed for dielectric material layer 20 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the high-k dielectric material can be selected from $HfO_2$, $ZrO_2$, and $TiO_2$. In one embodiment, the first high-k dielectric material can be $HfO_2$. The first high-k dielectric material can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

In one embodiment, the dielectric material layer 20 can include a dielectric material that is known to be suitable for an interlayer dielectric (ILD) material. For example, the dielectric material layer 20 can include porous or non-porous organosilicate glass (OSG), doped silicate glass, undoped silicate glass, silicon nitride, silicon oxynitride, nitrogen-doped organosilicate glass, or combinations thereof. In this case, the dielectric constant of the material of the dielectric material layer 20 can be in a range from 2.0 to 3.9. The interlayer dielectric material can be deposited, for example, by chemical vapor deposition, spin-coating, or a combination thereof. The thickness of the dielectric material layer 20 can be in a range from 10 nm to 300 nm, although lesser and greater thicknesses can also be employed.

The metallic material layer 30 can include an elemental metal, an alloy of at least two elemental metals, a compound of at least one metal and nitrogen, a compound of at least one metal and carbon, or a stack thereof. In one embodiment, the metallic material layer 30 can include any elemental metal, which can be an elemental transition metal, a Lanthanide, an Actinide, an alkali metal, or an alkaline earth metal. In another embodiment, the metallic material layer 30 can include an intermetallic alloy of at least two elemental metals. In one embodiment, the metallic material layer includes a metallic nitride, a metallic carbide, or an alloy or a stack thereof. Exemplary metallic nitride materials that can be employed for the metallic material layer 30 include, but are not limited to, titanium nitride, tantalum nitride, tungsten nitride, aluminum nitride, yttrium nitride, zirconium nitride, vanadium nitride, niobium nitride, and other nitrides of at least one metallic element. Exemplary metallic carbide materials that can be employed for the metallic material layer 30 include, but are not limited to, titanium carbide, tantalum carbide, tungsten carbide, zirconium carbide, vanadium carbide, niobium carbide, hafnium carbide, chromium carbide, molybdenum carbide, and other carbides of at least one metallic element. In one embodiment, the metallic material layer 30 can include a stack of multiple metallic layers having different compositions.

The metallic material layer 30 can be deposited, for example, by physical vapor deposition (sputtering), chemical vapor deposition, atomic layer deposition, or a combination thereof. The thickness of the metallic material layer 30 can be in a range from 1 nm to 30 nm, although lesser and greater thicknesses can also be employed.

The first organic planarization layer 40 includes an organic planarization material as known in the art. The organic planarization material of the first organic planarization layer 40 is herein referred to as a first organic planarization material. In one embodiment, the first organic planarization layer 40 can include a non-photosensitive organic polymer material. As used herein, a "non-photosensitive" material refers to a material that does not change chemical property upon irradiation for lithographic exposure employing a conventional light wavelength and a conventional dose level for exposure as known in the art. Exemplary materials that can be employed for the first organic planarization layer 40 include ODL-102, commercially available from ShinEtsu Chemical Co. Ltd.; HM8006 and HM8014, commercially available from JSR Corporation; and CHM701B, commercially available from Cheil Chemical Co. Ltd.

The first organic planarization layer 40 can be formed, for example, by a spin-on coating. The thickness of the first organic planarization layer 40 can be in a range from 30 nm to 600 nm, although lesser and greater thicknesses can also be employed.

The non-metallic hard mask layer 50 includes a non-metallic non-photosensitive material. In one embodiment, the non-metallic hard mask layer 50 can include a dielectric oxide, a dielectric nitride, or a dielectric oxynitride including a group IV element. For example, the non-metallic hard mask layer 50 can include a silicon oxide material, a silicon nitride material, or a silicon oxynitride material. In this case, the non-metallic hard mask layer 50 can be deposited by chemical vapor deposition, atomic layer deposition, spin coating, or a combination thereof.

In another embodiment, the non-metallic hard mask layer 50 can include a nitrogen-containing organosilicate glass (OSG), which includes Si, C, O, H, and N. An exemplary material for a nitrogen-containing OSG is NBLoK™ available from Applied Materials, Inc.

In yet another embodiment, the non-metallic hard mask layer 50 can include a silicon-containing antireflective coating (Si-ARC) material as known in the art. The Si-ARC material can be a polymer containing Si with organic units or halide bound to the silicon, which are generally polysiloxanes. The Si-ARC material can include more than 30% in atomic concentration of silicon. The Si-ARC material can be applied, for example, by spin coating, and can be cured at an elevated temperature around 220° C. during a post application bake (PAB) process.

In still another embodiment, the non-metallic hard mask layer 50 can include a dielectric metal oxide. Exemplary dielectric metal oxides include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The dielectric metal oxide material can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

The thickness of the non-metallic hard mask layer 50 can be in a range from 1 nm to 30 nm, although lesser and greater thicknesses can also be employed. In one embodiment, the thickness of the non-metallic hard mask layer 50 can be in a range from 3 nm to 10 nm.

The patterned photoresist layer 57 includes a photoresist material. The patterned photoresist layer 57 can be formed by forming a blanket photoresist material layer over the top surface of the non-metallic hard mask layer 50 by spin coating, lithographically exposing the blanket photoresist material layer by electromagnetic radiation or by an electron beam, and developing the lithographically exposed photoresist material layer. The thickness of the blanket photoresist material layer can be in a range from 50 nm to 1,000 nm, although lesser and greater thicknesses can also be employed. The lithographic exposure of the blanket photoresist layer can be performed by deep ultraviolet (DUV) lithography, mid-ultraviolet lithography (MUV), grayscale lithography, electron beam lithography, or a combination thereof. Depending on the nature of the photoresist material, the development process can remove lithographically exposed portions selective to lithographically unexposed portions of the photoresist material, or can remove lithographically unexposed portions of the photoresist material selective to the lithographically exposed portions of the photoresist material.

The patterned photoresist layer 57 includes at least one opening therein. A portion of the top surface of the non-metallic hard mask layer 50 is physically exposed underneath each opening in the patterned photoresist layer 57. The pattern of the opening in the patterned photoresist layer 57 corresponds to the area from which removal of the metallic material layer 30 is desired. The area of the remaining portions of the patterned photoresist layer 57 corresponds to the area in which preservation of the metallic material layer 30 is desired after patterning of the metallic material layer 30.

Figure 2:
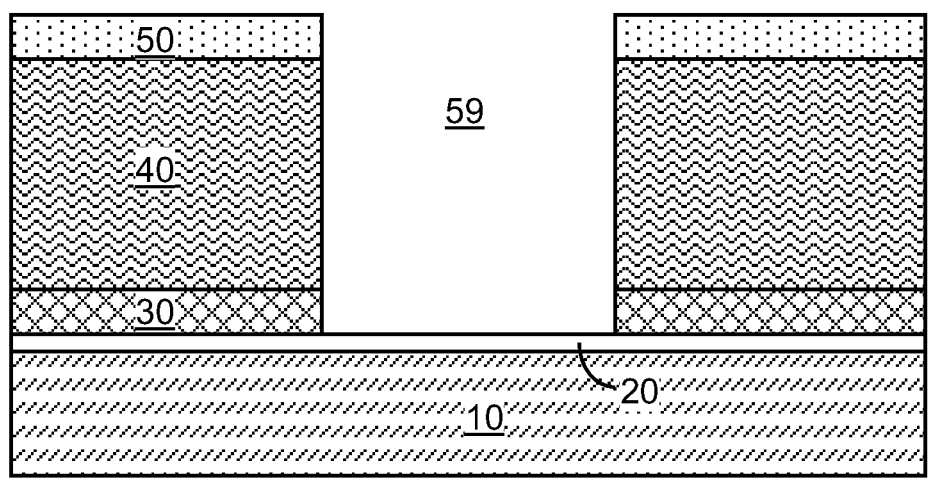
FIG. 2 is a vertical cross-sectional view of the exemplary structure after transfer of the pattern of in the photoresist layer into the dielectric mask layer, the first organic planarization layer, and the first metallic material layer by a set of at least one etch according to an embodiment of the present disclosure.

Referring to FIG. 2, the pattern in the patterned photoresist layer 57 is transferred through the stack of the non-metallic hard mask layer 50, the first organic planarization layer 40, and the metallic material layer 30 by at least one etch. In one embodiment, at least one anisotropic etch can be employed among the at least one etch that transfers the pattern in the patterned photoresist layer 57 is transferred through the stack of the non-metallic hard mask layer 50, the first organic planarization layer 40, and the metallic material layer 30. A cavity 59 is formed though the non-metallic hard mask layer 50, the first organic planarization layer 40, and the metallic material layer 30. A top surface of the dielectric material layer 20 is physically exposed underneath the cavity 59.

The non-metallic hard mask layer 50 can be etched, for example, by an anisotropic etch or an isotropic etch. The etch chemistry for etching the non-metallic hard mask layer 50 can be selected based on the material of the non-metallic hard mask layer as known in the art. The patterned photoresist layer 57 is employed as an etch mask during the etching of unmasked portions of the non-metallic hard mask layer 50. In one embodiment, the non-metallic hard mask layer 50 can be etched by a reactive ion etch, which is an anisotropic etch. In another embodiment, the non-metallic hard mask layer 50 can be etched by a wet etch, which is an isotropic etch.

Subsequently, the portion(s) of the first organic planarization layer 40 underlying each opening in the patterned photoresist layer 57 can be etched by another etch. In one embodiment, the first organic planarization layer 40 can be etched employing an anisotropic etch process, which forms vertical sidewalls in the first organic planarization layer 40 as the etch process proceeds. The patterned photoresist layer 57 can be vertically recessed during the etching of the first organic planarization layer 40. A cavity 59 is formed in the first organic planarization layer 40 underneath each opening in the patterned photoresist layer 57. In one embodiment, the patterned photoresist layer 57 can be completely consumed before, or at the time of, the cavity 59 reaching the interface between the first organic planarization layer 40 and the metallic material layer. In one embodiment, the sidewalls of the non-metallic hard mask layer 50 and the sidewalls of the first organic planarization layer 40 can be vertically coincident among one another after formation of the cavity 59. As used herein, a first surface and a second surface are vertically coincident with each other if the first surface overlies, or underlies, the second surface and a vertical plane including the first surface and the second surface exists.

The physically exposed portion of the metallic material layer 30 underlying the cavity 59 can be subsequently removed by another etch, which can be an isotropic etch or an anisotropic etch. In one embodiment, the physical exposed portion of the metallic material layer 30 can be removed by a wet etch. In one embodiment, the chemistry of the etch process employed to etch the metallic material layer 30 can be selected to avoid damaging the material of the dielectric material layer 20. Suitable etch chemistries known in the art can be employed to etch the metallic material layer 30 while minimizing collateral etching of the dielectric material layer 20. Methods for selective wet etching of metal nitrides can be found, for example, in United States Patent Application No. 2006/0226122A1. In another example, if the metallic material layer 30 includes titanium nitride and if the dielectric material layer 20 includes a dielectric metal oxide, the metallic material layer 30 can be etched selective to the dielectric oxide material by a wet etch employing a mixture of hydrogen peroxide and ethylenediaminetetraacetic acid. In an illustrative example, a 1:1 mixture of hydrogen peroxide and ethylenediaminetetraacetic acid elevated to a temperature of 60° C. or higher can be employed to etch a titanium nitride film selective to a dielectric metal oxide material.

Figure 3:
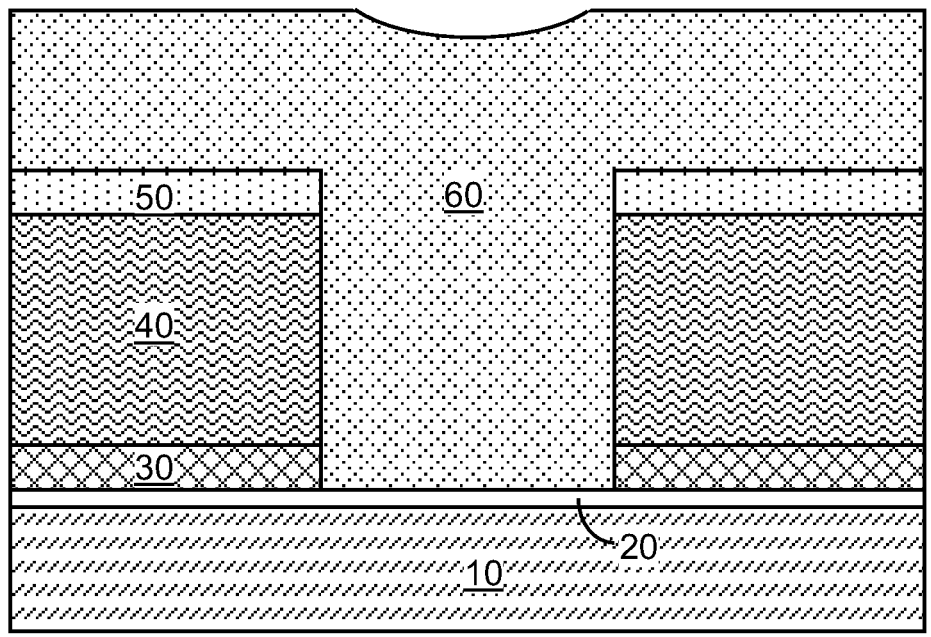
FIG. 3 is a vertical cross-sectional view of the exemplary structure after application of a second organic planarization layer according to an embodiment of the present disclosure.

Referring to FIG. 3, a second organic planarization layer 60 is deposited in the cavity 59 (See FIG. 2) and over the non-metallic hard mask layer 50. Specifically, the second organic planarization layer 60 is deposited into the cavity 59 and over the non-metallic hard mask layer 50. The second organic planarization layer 60 can be formed directly on a top surface and sidewalls of the remaining portion of the non-metallic hard mask layer 50 that remains after the at least one anisotropic etch that forms the cavity 59 and the etch process that forms an opening in the metallic material layer 30.

The second organic planarization layer 60 can include any organic planarization material that can be employed as the first organic planarization layer 40. The organic planarization material of the second organic planarization layer 60 is herein referred to as a second organic planarization material. The first organic planarization material and the second organic planarization material may, or may not, be the same as the organic planarization material of the first organic planarization material layer 40. In one embodiment, each of the first and second organic planarization layers (40, 60) can include a non-photosensitive organic polymer material. In this case, the non-photosensitive organic polymer material of the second organic planarization layer 60 can be selected independent of the non-photosensitive organic polymer material of the first organic planarization layer 40.

The second organic planarization layer 60 can be applied, for example, by spin coating of an organic planarization material. In one embodiment, a dimple may be present on the top surface of the second organic planarization layer 60 over the volume of each cavity 59 (See FIG. 2) that is filled with the organic planarization material of the second organic planarization layer 60. The thickness of the second organic planarization layer 60, as measured above the top surface of the non-metallic hard mask layer 50, may be in a range from 1 nm to 300 nm, although lesser and greater thicknesses can also be employed. Alternatively, the topmost surface of the second organic planarization layer 60 may be formed below the horizontal plane including the top surface of the non-metallic hard mask layer 50.

The second organic planarization layer 60 can be employed to minimize additional collateral etching of the dielectric material layer 20 after the patterning of the metallic material layer 30 and during the removal of the non-metallic hard mask layer 59, and the first organic planarization layer 40. Specifically, the organic planarization material of the second organic planarization layer 60 that is present on the top surface of the dielectric material layer 20 protects the dielectric material layer 20 during subsequent processing steps for removal of the non-metallic hard mask layer 59, and during an initial portion of the processing step for removal of the first organic planarization layer 40.

Figure 4:
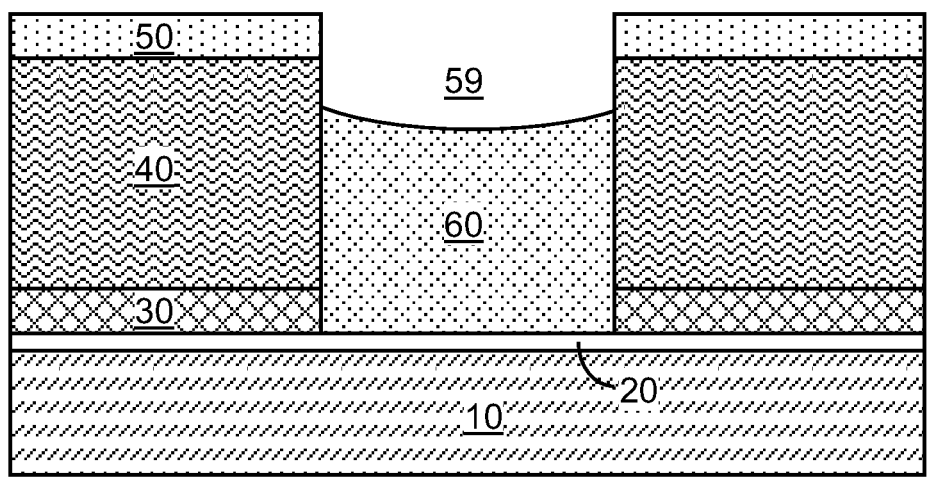
FIG. 4 is a vertical cross-sectional view of the exemplary structure after recessing the second organic planarization layer and collateral removal of any remaining portion of the photoresist layer according to an embodiment of the present disclosure.

Referring to FIG. 4, an upper portion of the second organic planarization layer 60 is recessed by an etch process or by an ashing process such that the recessed top surface of the second organic planarization layer 60 is present below the horizontal plane including the top surface of the non-metallic hard mask layer 50.

In one embodiment, the upper portion of the second organic planarization layer 60 can be removed by a dry etch. The dry etch can be an anisotropic etch such as a reactive ion etch, or an isotropic etch as chemical downstream etch. In one embodiment, the upper portion of the second organic planarization layer 60 can be removed by an ashing process, in which the organic planarization material of the second organic planarization layer 60 combines with oxygen, becomes volatilized, and is removed in a gas phase out of a processing chamber.

In one embodiment, the recessing of the upper portion of the second organic planarization layer 60 can be performed employing an etch process that is selective to the material of the non-metallic hard mask layer 50. In another embodiment, the recessing of the upper portion of the second organic planarization layer 60 can be performed employing an etch process that is not selective to the material of the non-metallic hard mask layer 50.

The second planarization layer 60 partially fills each cavity within the vertical stack of the metallic material layer 30, the first organic planarization layer 40, and the non-metallic hard mask layer 50 (if present). In one embodiment, the top surface of the remaining portion of the second organic planarization layer 60 within each cavity may have a concave top surface due to a dimple in the top surface of the second organic planarization layer 60 as formed at the processing step of FIG. 3 and due to the geometrical effects of the cavity 59 during the recessing of the second organic planarization layer 60.

Figure 5:
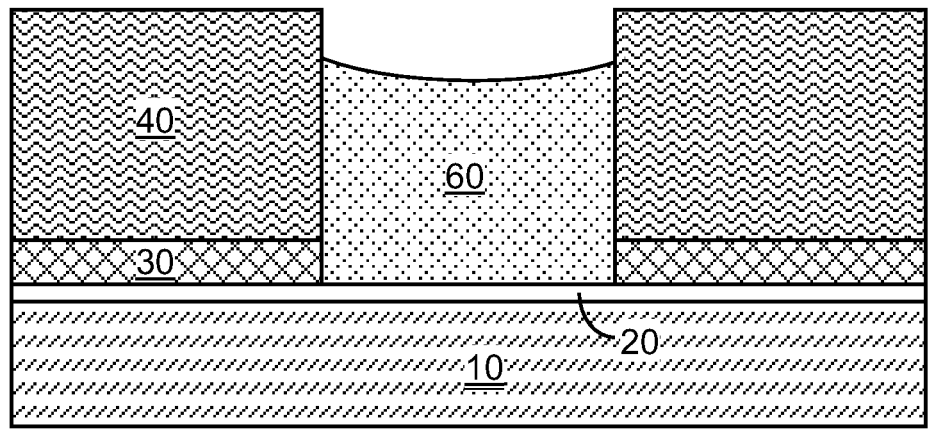
FIG. 5 is a vertical cross-sectional view of the exemplary structure after removal of the dielectric mask layer according to an embodiment of the present disclosure.

Referring to FIG. 5, the dielectric mask layer 50, if not collaterally etched during the recessing of the second organic planarization layer 60 at the processing step of FIG. 4, can be removed. The removal of the dielectric mask layer 50 can be performed by an etch, which can be an anisotropic etch such as a reactive ion etch or an isotropic etch such as a wet etch. The etch process that is employed to remove the dielectric mask layer 50 may, or may not, be selective to the materials of the first organic planarization layer 40 and/or the second organic planarization layer 60. A suitable etch chemistry may be employed to remove the non-metallic hard mask layer 50 as known in the art. The presence of the organic planarization material of the second organic planarization layer 60 on the top surface of the dielectric material layer 20 provides protection for the top surface of the dielectric material layer 20 underlying the cavity 59 from collateral etching during the removal of the non-metallic hard mask layer 50.

Figure 6:
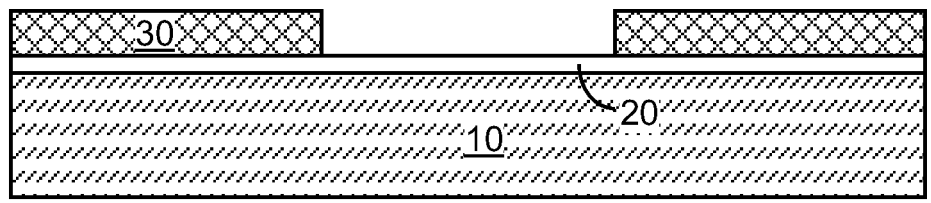
FIG. 6 is a vertical cross-sectional view of the exemplary structure after removal of the first and second organic planarization layers according to an embodiment of the present disclosure.

Referring to FIG. 6, the remaining lower portion of the second organic planarization layer 60 and the first organic planarization layer 40 are removed selective to the dielectric material in the dielectric material layer 20. The lower portion of the second organic planarization layer 60 and the first organic planarization layer 40 are removed simultaneously employing a same etch process.

In one embodiment, the lower portion of the second organic planarization layer 60 and the first organic planarization layer 40 can be removed by an ashing process, in which the organic planarization materials of the first and second organic planarization layers (40, 60) combine with oxygen, become volatilized, and are removed in a gas phase out of a processing chamber. In another embodiment, the lower portion of the second organic planarization layer 60 and the first organic planarization layer 40 can be removed by a dry etch. The dry etch can be an anisotropic etch such as a reactive ion etch, or an isotropic etch as chemical downstream etch.

The simultaneous removal of the lower portion of the second organic planarization layer 60 and the first organic planarization layer 40 can be performed employing a process that is selective to the material of the dielectric material layer 20. In one embodiment, the height of the recessed top surface of the second organic planarization layer 60 during the recess etch at the processing step of FIG. 4 can be selected such that the top surface of the dielectric material layer 20 and the top surface of the metallic material layer 30 become physically exposed simultaneously, or with minimal differences in time. In this case, the overetch time needed to remove bottommost portions of the first and second organic planarization layers (40, 60) can be minimized, thereby minimizing any collateral damage to the physically exposed top surface of the dielectric material layer 20.

After removal of the remaining lower portion of the second organic planarization layer 60 and the first organic planarization layer 40, the top surface of the dielectric material layer 20 within the region of the cavity 59 becomes physically exposed again. Optionally, a surface clean process may be performed to remove any residual material derived from the first and second organic planarization layers (40, 60). For example, a wet clean employing the SC1 etch chemistry can be performed to remove organic residues from the top surfaces of the dielectric material layer 20 and the metallic material layer 30. The SC1 etch chemistry can employ, for example, a 1:1:5 solution of 27 volume % of ammonium hydroxide in water, 30 volume % of hydrogen peroxide in water, and deionized water at a temperature range about 80° C. The duration of the wet etch can be optimized based on the thickness of the metallic material layer 30.

Additional material stacks can be subsequently deposited on the exemplary structure illustrated in FIG. 6. Such additional material stacks can include another metallic material layer and/or a doped or undoped semiconductor material layer and/or another dielectric material layer as known in the art.

Figure 7:
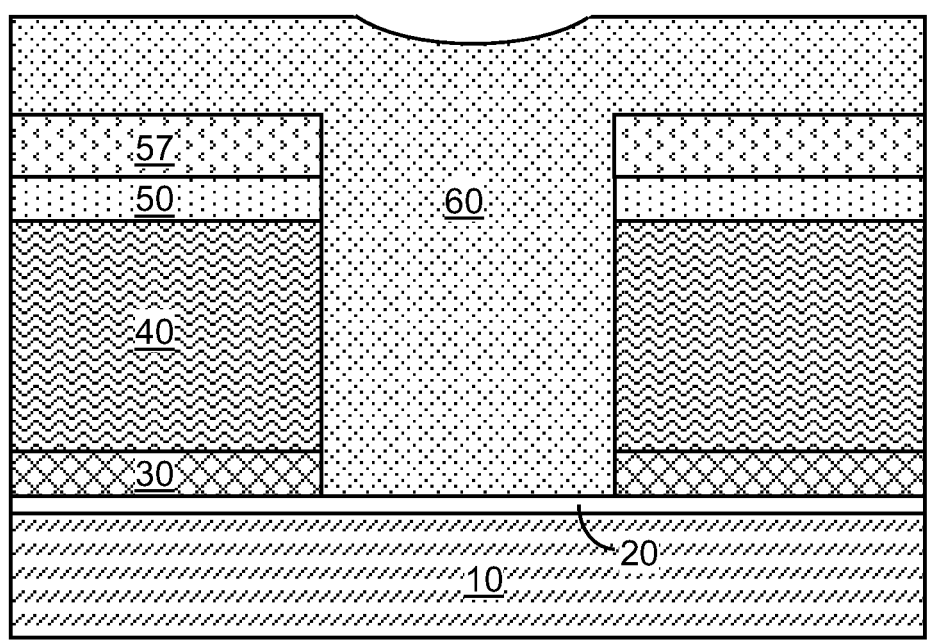
FIG. 7 is a vertical cross-sectional view of a variation of the exemplary structure after application of a second organic planarization layer according to an embodiment of the present disclosure.

Referring to FIG. 7, a vertical cross-sectional view of a variation of the exemplary structure is shown at the processing step corresponding to the processing step of FIG. 3 for the exemplary structure. In the variation of the exemplary structure, the patterned photoresist layer 57 may not be completely consumed during the processing steps of FIG. 2. The second organic planarization layer 60 is deposited into the cavity 59 and directly on a top surface and sidewalls of the patterned photoresist layer 57, the sidewalls of the non-metallic hard mask layer 50, the sidewalls of the first organic planarization layer 40, the sidewalls of the metallic material layer 30, and the top surface of the dielectric material layer 20.

Subsequently, the processing steps of FIGS. 4-6 can be performed to provide the exemplary structure illustrated in FIG. 6. The remaining portions of the patterned photoresist layer 57 can be removed collaterally during the processing step of FIG. 4, i.e., during the recessing of the second organic planarization layer 60.

The various methods of the present disclosure can be employed to provide a dielectric material layer 20 in contact with a bottom surface of a patterned metallic material layer 30 while minimizing structural or chemical damages to the physically exposed portions of the dielectric material layer 20. The methods of the present disclosure can be advantageously employed in any device structure that requires a dielectric material layer with structural and chemical integrity, i.e., a dielectric material layer with no, or minimal, structural and chemical changes in the dielectric material in regions that do not contact the metallic material layer 30.

An exemplary application of the methods of the present disclosure is patterning of a work function material layer formed directly on a top surface of a high-k dielectric material layer during formation of gate electrodes for field effect transistors. In this case, the high-k dielectric material layer can be the dielectric material layer 20 of the present disclosure, and the work function material layer can be the metallic material layer 30 of the present disclosure. The high-k dielectric material layer can be a predominant portion of gate dielectrics for the field effect transistors. As such, any structural or chemical damage to the high-k dielectric material layer can be detrimental to performance and/or reliability of the field effect transistors that employ the high-k dielectric material layer as gate dielectrics. By minimizing the collateral etching during the processing steps for removal of the non-metallic hard mask layer 50, the methods of the present disclosure enhances the performance and/or the reliability of semiconductor devices employing the dielectric material layer 20.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a patterned structure comprising:
   forming a vertical stack including, from bottom to top, a metallic material layer, a first organic planarization layer, and a non-metallic hard mask layer over a dielectric material layer on a substrate;
   forming a cavity through said non-metallic hard mask layer, said first organic planarization layer, and said metallic material layer, wherein a top surface of said dielectric material layer is physically exposed underneath said cavity;
   applying a second organic planarization layer in said cavity and over said non-metallic hard mask layer;
   recessing an upper portion of said second organic planarization layer;
   removing said non-metallic hard mask layer; and
   removing a lower portion of said second organic planarization layer and said first organic planarization layer, wherein said top surface of said dielectric material layer is physically exposed again.

2. The method of claim 1, wherein said lower portion of said second organic planarization layer and said first organic planarization layer are removed simultaneously.

3. The method of claim 1, further comprising:
   forming a patterned photoresist layer over said non-metallic hard mask layer; and
   transferring a pattern in said patterned photoresist layer through said non-metallic hard mask layer, said first organic planarization layer, and said metallic material layer employing at least one anisotropic etch.

4. The method of claim 3, wherein said pattern in said patterned photoresist layer includes an opening, and said cavity is formed in a region underlying said opening in said patterned photoresist layer.

5. The method of claim 3, wherein said second organic planarization layer is formed directly on a top surface and sidewalls of a remaining portion of said patterned photoresist layer that remains after said at least one anisotropic etch.

6. The method of claim 5, further comprising removing said remaining portion of said patterned photoresist layer during recessing of said upper portion of said second organic planarization layer.

7. The method of claim 3, wherein said second organic planarization layer is formed directly on a top surface of said non-metallic hard mask layer.

8. The method of claim 3, wherein said second organic planarization layer is formed by spin coating of an organic planarization material.

9. The method of claim 1, wherein sidewalls of said non-metallic hard mask layer and sidewalls of said first organic planarization layer are vertically coincident among one another after formation of said cavity.

10. The method of claim 1, wherein said first organic planarization layer is etched by a dry etch, and said metallic material layer is etched by a wet etch during formation of said trench.

11. The method of claim 1, wherein said upper portion and said lower portion of said second organic planarization layer are removed by dry etches.

12. The method of claim 1, wherein said recessing of said upper portion of said second organic planarization layer is performed employing an anisotropic etch process that is selective to a material of said non-metallic hard mask layer.

13. The method of claim 1, wherein removal of said lower portion of said second organic planarization layer and said first organic planarization layer is performed employing a dry etch that is selective to said dielectric material layer.

14. The method of claim 1, wherein removal of said lower portion of said second organic planarization layer and said first organic planarization layer is performed employing an ashing process.

15. The method of claim 1, wherein said dielectric material layer includes a dielectric material having a dielectric constant greater than 7.9.

16. The method of claim 15, wherein said dielectric material layer includes a dielectric metal oxide.

17. The method of claim 1, wherein said non-metallic hard mask layer includes a silicon oxide material, a silicon nitride material, or a silicon oxynitride material, and is deposited by chemical vapor deposition.

18. The method of claim 1, wherein said non-metallic hard mask layer includes a silicon-containing antireflective coating material.

19. The method of claim 1, wherein said metallic material layer comprises a material selected from an elemental metal, an alloy of at least two elemental metals, a compound of at least one metal and nitrogen, a compound of at least one metal and carbon, and a stack thereof.

20. The method of claim 1, wherein each of said first and second organic planarization layer includes a non-photosensitive organic polymer material.

* * * * *